United States Patent
Kar-Roy et al.

(10) Patent No.: US 9,136,157 B1
(45) Date of Patent: Sep. 15, 2015

(54) DEEP N WELLS IN TRIPLE WELL STRUCTURES

(75) Inventors: Arjun Kar-Roy, Irvine, CA (US);
Marco Racanelli, Santa Ana, CA (US);
Jinshu Zhang, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 11/198,425

(22) Filed: Aug. 5, 2005

Related U.S. Application Data

(62) Division of application No. 10/411,054, filed on Apr. 9, 2003, now Pat. No. 7,052,966.

(51) Int. Cl.
*H01L 21/761* (2006.01)
*H01L 27/092* (2006.01)

(52) U.S. Cl.
CPC .......... *H01L 21/761* (2013.01); *H01L 27/0928* (2013.01)

(58) Field of Classification Search
CPC .......................... H01L 21/761; H01L 27/0928
USPC ................... 257/511, 504, E29.019, 544–556
See application file for complete search history.

(56) References Cited

U.S. PATENT DOCUMENTS

| | | | | |
|---|---|---|---|---|
| 5,789,309 | A | * | 8/1998 | Hellwig ........................ 438/478 |
| 5,899,714 | A | | 5/1999 | Farrenkopf et al. |
| 5,929,506 | A | * | 7/1999 | Hutter et al. .................. 257/544 |
| 6,033,946 | A | * | 3/2000 | Hutter et al. .................. 438/202 |
| 6,291,875 | B1 | * | 9/2001 | Clark et al. .................... 257/622 |
| 6,528,850 | B1 | * | 3/2003 | Hebert .......................... 257/345 |
| 6,617,647 | B2 | | 9/2003 | Yamazaki |
| 2004/0032005 | A1 | * | 2/2004 | Williams et al. .............. 257/510 |

* cited by examiner

*Primary Examiner* — Richard Elms
*Assistant Examiner* — Jerome Leboeuf
(74) *Attorney, Agent, or Firm* — Farjami & Farjami LLP

(57) ABSTRACT

A disclosed method for fabricating a structure in a semiconductor die comprises steps of implanting a deep N well in a substrate, depositing an epitaxial layer over the substrate, and forming a P well and a lateral isolation N well over the deep N well, wherein the lateral isolation N well and the P well are fabricated in the substrate and the epitaxial layer, and wherein the lateral isolation N well laterally surrounds the P well, and wherein the deep N well and the lateral isolation N well electrically isolate the P well. Implanting a deep N well can comprise steps of depositing a screen oxide layer over the substrate, forming a mask over the screen oxide layer, implanting the deep N well in the substrate, removing the mask, and removing the screen oxide layer. Depositing the epitaxial layer can comprise depositing a single crystal silicon over the substrate.

13 Claims, 5 Drawing Sheets

DEEP N WELLS IN TRIPLE WELL STRUCTURES

This is a divisional of application Ser. No. 10/411,054 filed Apr. 9, 2003 now U.S. Pat. No. 7,052,966.

BACKGROUND OF THE INVENTION

1. Field of the Invention

The present invention is generally in the field of semiconductor fabrication. More specifically, the invention is in the field of fabricating deep N wells and triple well structures in semiconductor dies.

2. Background Art

High performance semiconductor devices include a high density of various mixed signal and RF circuits. The transistors in these circuits often require isolation from each other to prevent exposure to unwanted noise. As is known in the art, N type field effect transistors ("NFETs") are typically fabricated in a P type substrate ("P substrate"). Also, it is common to fabricate P type field effect transistors ("PFETs") in N type wells ("N wells") situated within the same P substrate. In this commonly known technique, the PFETs generally have adequate isolation from noise from the substrate or adjacent NFETs since the PFETs are situated within small, local, and isolated N wells which are typically reverse biased or otherwise isolated from the P substrate. However, as compared with the PFETs, the NFETs are generally subject to more noise since the NFETs are situated within, and are not isolated from, the large P substrate which itself is subject to noise from various sources, such as ground noise.

Some conventional isolation structures, such as triple well structures, use deep N wells to isolate transistors from noise from the substrate or adjacent transistors. An exemplary triple well structure comprises an isolated P well surrounded by a lateral isolation N well and a deep N well, all situated within the P substrate. The deep N well must be situated in the P substrate at sufficient depth, for example at approximately 2.0 microns below the surface of the P substrate, in order to preserve proper NFET characteristics and to, for example, prevent leakage. The lateral isolation N well laterally surrounds the isolated P well and is in contact with the deep N well. Thus, the isolated P well is enclosed by the deep N well below and the lateral isolation N well around. The NFETs are fabricated within the isolated P wells while the PFETs are, as before, fabricated in the isolated N wells. The isolated P well is electrically isolated from the P substrate by the lateral isolation N well and the deep N well when the isolated P well is reverse biased in relation to the lateral isolation N well and the deep N well. Thus, the triple well structure helps prevent noise from adversely affecting the NFETs fabricated within the isolated P well and the devices fabricated outside the isolated P well.

Disadvantageously, conventional deep N well fabrication techniques require high energy implants in order to achieve the deep implanted N well while, by the same token, requiring thick photoresist masks to prevent the high energy implants from reaching the P substrate underlying the masked regions. The substantial depth of implant, and use of high energy implant and thick photoresist result in longer fabrication times and reduced precision in controlling the exact depth and geometry of the deep implanted N well regions; such requirements being significant drawbacks in conventional triple well isolation structures.

Therefore, a need exists for a triple well technology which requires lower energy implants, thinner photoresist, and which results in reduced fabrication time and increased precision of the depth and geometry of the deep N well regions.

SUMMARY OF THE INVENTION

The present invention is directed to deep N wells in triple well structures and method for fabricating same. The invention overcomes the need in the art for a triple well technology which requires lower energy implants, thinner photoresist, and which results in reduced fabrication time and increased precision of the depth and geometry of the deep N well regions.

According to one embodiment, the present invention is a method for fabricating a structure in a semiconductor die comprising steps of implanting a deep N well in a substrate, depositing an epitaxial layer over the substrate, and forming a P well and a lateral isolation N well over the deep N well, wherein the lateral isolation N well and the P well are fabricated in the substrate and the epitaxial layer, and wherein the lateral isolation N well laterally surrounds the P well, and wherein the deep N well and the lateral isolation N well electrically isolate the P well. The step of implanting a deep N well can comprise steps of depositing a screen oxide layer over the substrate, forming a mask over the screen oxide layer, implanting the deep N well in the substrate, removing the mask, and removing the screen oxide layer. The step of depositing the epitaxial layer can comprise depositing a single crystal silicon over the substrate. The method can further comprise a step of forming at least one NFET in the P well. In other embodiments, the invention is a structure fabricated according to the above method. Other features and advantages of the present invention will become more readily apparent to those of ordinary skill in the art after reviewing the following description and accompanying drawings.

DETAILED DESCRIPTION OF THE INVENTION

The present invention is directed to deep N wells in triple well structures and method for fabricating same. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
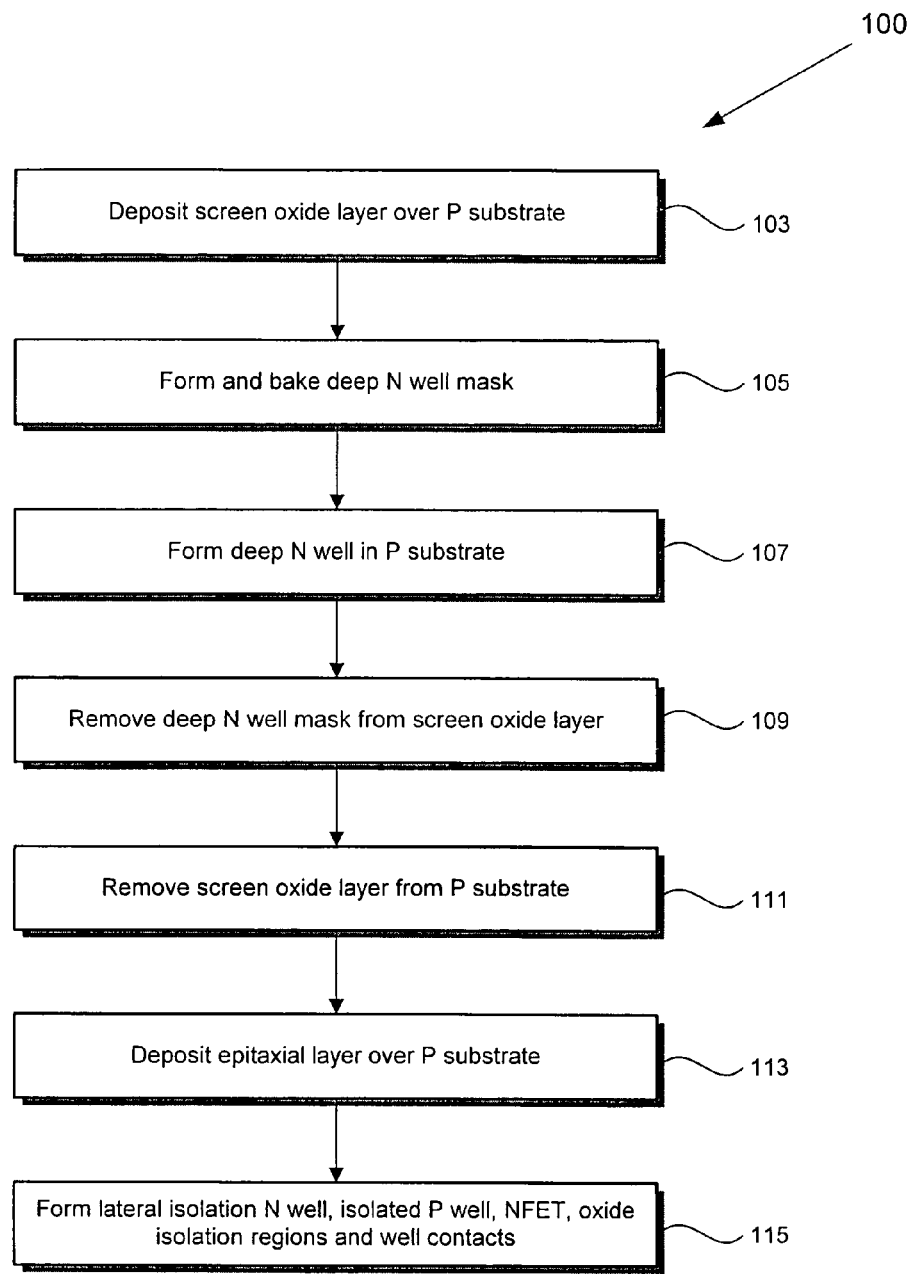
FIG. 1 shows a flowchart illustrating the steps taken to implement an embodiment of the invention.

FIG. 1 shows a flowchart illustrating exemplary process steps taken to implement an embodiment of the invention. Certain details and features have been left out of flowchart 100 of FIG. 1 that are apparent to a person of ordinary skill in the art. For example, a step may consist of one or more sub-steps or may involve specialized equipment or materials, as known in the art. While steps 103 through 115 indicated in flowchart 100 are sufficient to describe one embodiment of the present invention, other embodiments of the invention may utilize steps different from those shown in flowchart 100. It is noted that the processing steps shown in flowchart 100 are performed on a wafer which, prior to step 103, includes a substrate.

Figure 2A:
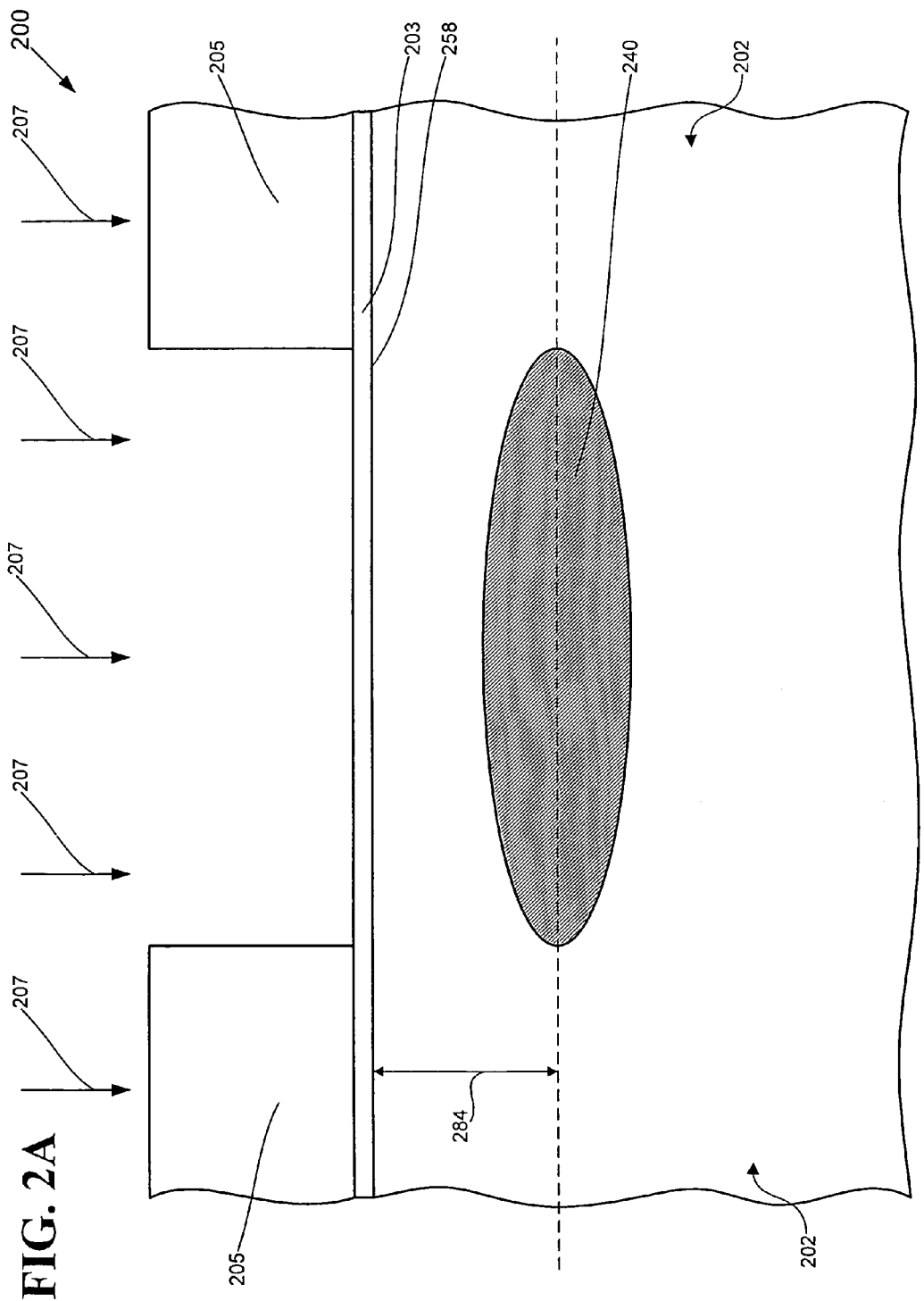
FIG. 2A shows a cross-sectional view of some of the features of a structure in an intermediate stage of fabrication, formed in accordance with one embodiment of the invention.
Figure 2B:
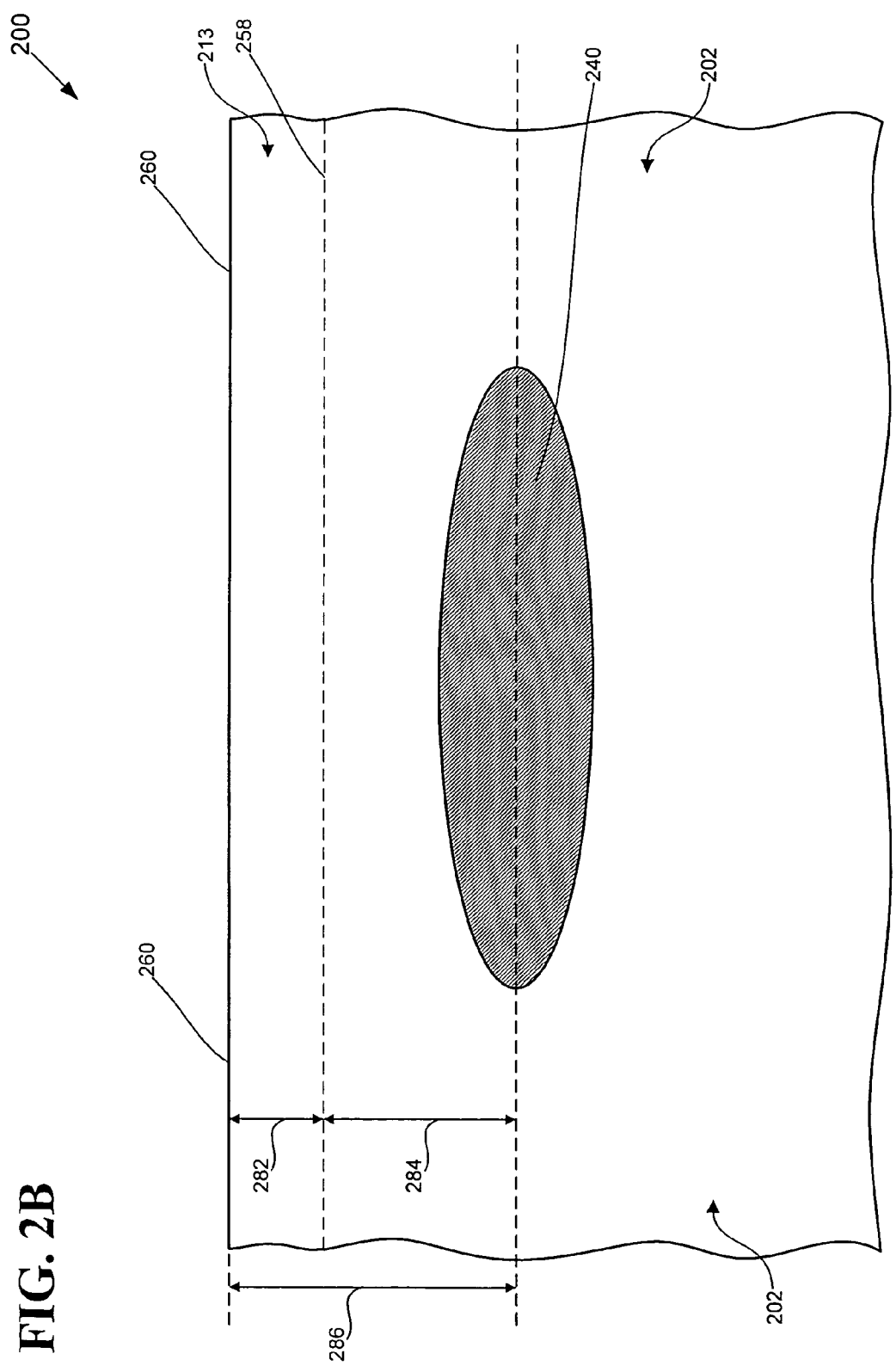
FIG. 2B shows a cross-sectional view of some of the features of a structure in an intermediate stage of fabrication, formed in accordance with one embodiment of the invention.
Figure 2C:
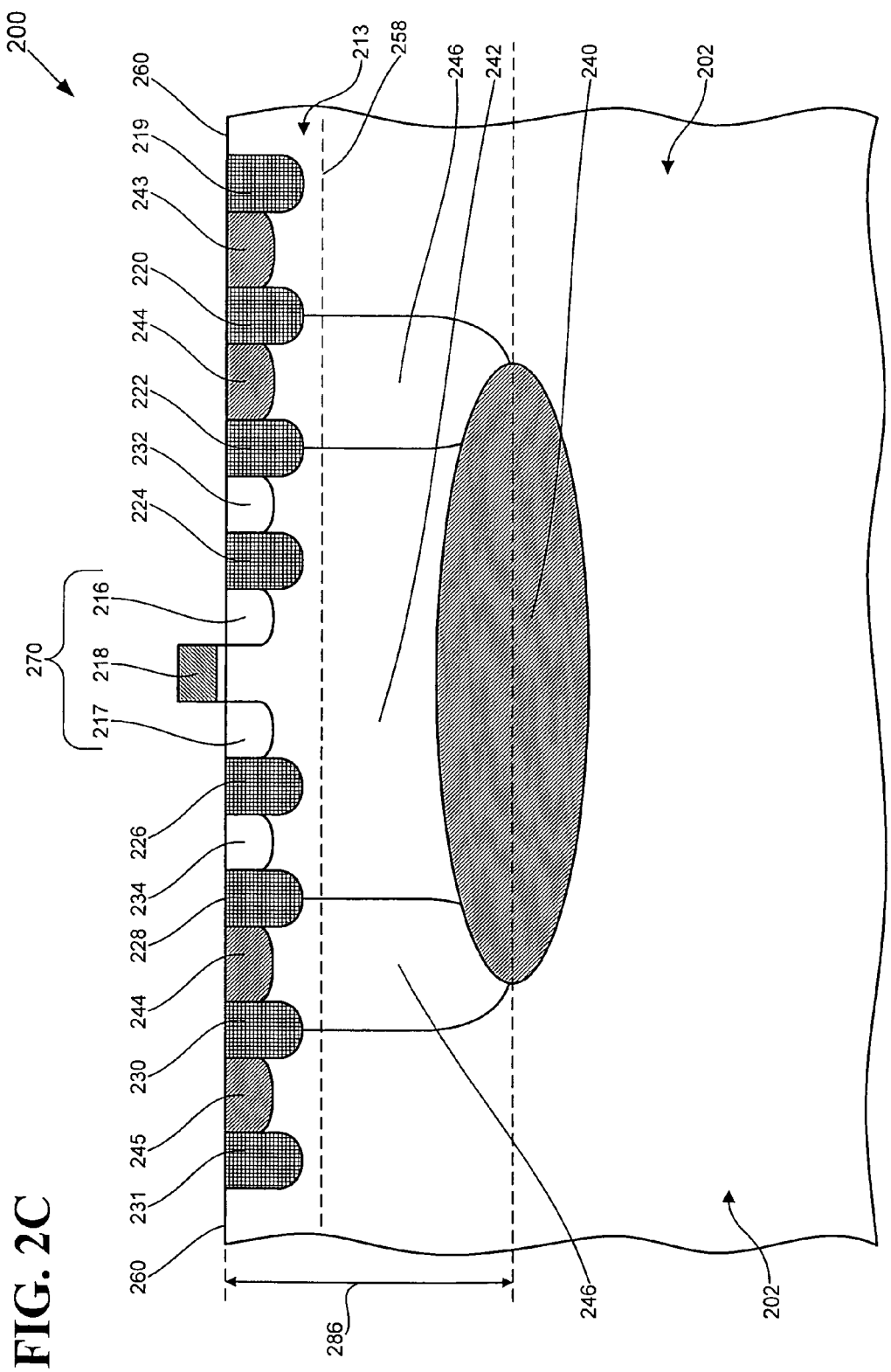
FIG. 2C shows a cross-sectional view of some of the features of a structure formed in accordance with one embodiment of the invention.

FIGS. 2A, 2B and 2C show cross-sectional views of some of the features of a triple well structure in intermediate stages of fabrication, formed in accordance with one exemplary embodiment of the invention. These intermediate stages of fabrication show some of the features of deep N well fabrication of an exemplary triple well structure, formed in accordance with one exemplary embodiment of the present invention. These fabrication stages are described in greater detail further below in relation to flowchart 100 of FIG. 1.

Referring to FIGS. 1 and 2A, at step 103 in flowchart 100, screen oxide layer 203 is deposited over P substrate 202. In one embodiment, P substrate 202 is a lightly-doped P type region, which can be formed in a manner known in the art. Screen oxide layer 203 can have a thickness of, for example, approximately 135 Angstroms. At step 105 in flowchart 100, deep N well mask 205 is formed over screen oxide layer 203 and deep N well mask 205 is baked. In one embodiment, deep N well mask 205 is formed by depositing and patterning a layer of photoresist on screen oxide layer 203 in a manner known in the art. Deep N well mask 205 can be baked, for example, with deep ultraviolet light (DUV) in a manner known in the art.

At step 107 in flowchart 100, deep N well 240 is formed by implanting N type ions, for example, phosphorous ions or arsenic ions, represented by arrows 207, into P substrate 202 in a manner known in the art. As shown in FIG. 2A, deep N well 240 is situated in P substrate 202 at depth 284, which is defined as the distance between top surface 258 of P substrate 202 and the midpoint of deep N well 240 as shown in FIG. 2A. By way of an example, depth 284 can be approximately 1.4 microns. In one embodiment, deep N well 240 is a heavily doped N type region. At step 109 in flowchart 100, deep N well mask 205 is removed from screen oxide layer 203 by a stripping process in a manner known in the art.

At step 111 in flowchart 100, screen oxide layer 203 is removed from P substrate 202 in a manner known in the art. In one embodiment, step 111 in flowchart 100 further comprises a cleaning process performed prior to removal of screen oxide layer 203. In one embodiment, step 111 in flowchart 100 is followed by an annealing process performed subsequent to removal of screen oxide layer 203, which helps correct lattice defects that can occur during implantation at step 107.

Referring to FIGS. 1 and 2B, at step 113 in flowchart 100, epitaxial layer 213 is deposited on P substrate 202 in a manner known in the art. Epitaxial layer 213 is situated on top surface 258 of P substrate 202. Epitaxial layer 213 can, for example, comprise silicon. In one embodiment, epitaxial layer 213 comprises single crystal silicon. Epitaxial layer 213 has depth 282, which is the distance between top surface 260 of epitaxial layer 213 and top surface 258 of P substrate 202. By way of example, depth 282 can be approximately 0.6 microns. Epitaxial layer 213 can be lightly doped in a manner known in the art. As shown in FIG. 2B, epitaxial layer 213 increases the effective depth of deep N well 440 to depth 286, which is defined as the distance between top surface 260 of epitaxial layer 213 and the midpoint of deep N well 240 as shown in FIG. 2B. By way of example, depth 286 can be approximately 2.0 microns, however a substantially different depth can also be achieved. Thus, according to one embodiment of the present invention, the effective depth of deep N well 240 is substantially the same as that in conventional techniques (according to other embodiments of the invention, depth of deep N well 240 can be quite different from that in conventional techniques) However, according to the present invention, the dopants are required to penetrate a substantially smaller depth as compared with conventional techniques.

Forming structure 200 in the manner described above in relation to steps 103 through 113 in flowchart 100, advantageously allows deep N well 240 to be implant doped using lower energy implants as compared to conventional techniques since, according to the present invention and as stated above, deep N well 240 is implant doped at depth 284 which is substantially less than depth 286 in conventional techniques. As such, one advantage of the present invention is increased fabrication throughput due to the ability to achieve a reduced implant depth during shorter time intervals. Moreover, according to the present invention, a thin photoresist mask suffices to prevent the relatively low energy implant from reaching the P substrate underlying the masked regions. As such, another advantage of the present invention is increased accuracy and geometry control due to thinner photoresist, lower energy implants, and smaller depth requirement, all of which together allow a more accurate control over the exact geometry and depth of the implanted regions. Moreover, according to the present invention, depositing epitaxial layer 213 at step 113 and its associated thermal budget have the additional benefit of activating dopants and rectifying defects in deep N well 240.

Referring to FIGS. 1 and 2C, at step 115 in flowchart 100, after forming deep N well 240 as described above, lateral isolation N well 246, isolated P well 242, NFET 270, oxide isolation regions 219, 220, 222, 224, 226, 228, 230 and 231, and isolated P well contacts 232 and 234, lateral isolation N well contacts 244, and P substrate contacts 243 and 245 are also formed in structure 200. Lateral isolation N well 246 is formed in epitaxial layer 213 and P substrate 202 in a manner known in the art. Lateral isolation N well 246 extends from top surface 260 of epitaxial layer 213 to deep N well 240. In one embodiment, lateral isolation N well 246 is a lightly doped N type region; while in another embodiment, lateral isolation N well 246 is a heavily doped N type region which advantageously reduces resistance between deep N well 240 and lateral isolation N well 246.

As shown in FIG. 2C, isolated P well 242 is formed in the region of epitaxial layer 213 and P substrate 202 above deep N well 240 and is laterally surrounded by lateral isolation N well 246. In one embodiment, isolated P well 242, which can be defined by a P well mask, is a lightly doped P type region, which can be formed by implanting P type dopants. When reverse biased (as is typically the case), isolated P well 242 is electrically isolated from P substrate 202 by deep N well 240 and lateral isolation N well 246. NFET 270 is formed in isolated P well 242 and includes N+ source 216, N+ drain 217, and gate 218. In one embodiment, gate 218 may be formed by depositing and patterning a layer of polysilicon over a gate oxide in a manner known in the art.

Oxide isolation regions 219, 220, 222, 224, 226, 228, 230 and 231 are formed near top surface 260 and can be formed by, for example, a shallow trench isolation process or a thermally grown LOCOS process, both well known in the art. As shown in FIG. 2C, oxide isolation regions 220, 222, 228, and 230 are situated adjacent to lateral isolation N well 246 while oxide isolation regions 224 and 226 are situated adjacent to NFET 270. Oxide isolation regions 219 and 220 are situated adjacent to P substrate contact 243 and oxide isolation regions 230 and 231 are situated adjacent to P substrate contact 245.

P well contacts 232 and 234 are formed in isolated P well 242 near top surface 260 and are situated between oxide isolation regions 222, 224 and 226, 228, respectively. In one embodiment, P well contacts 232 and 234 are heavily doped P type regions. P well contacts 232 and 234 allow an appropriate bias voltage, such as ground, to be applied to isolated P well 242.

N well contacts 244 are formed in lateral isolation N well 246 and are situated within epitaxial layer 213. N well contacts 244 allow an appropriate bias voltage, such as $V_{dd}$, to be connected to lateral isolation N well 246 and deep N well 240. In one embodiment, N well contacts 244 are heavily doped N type regions. As described further below with regard to FIG. 3, lateral isolation N well 246 is electrically connected to deep N well 240 to aid in providing electrical isolation between isolated P well 242 and P substrate 202. P substrate contacts 243 and 245 are formed in epitaxial layer 213 and situated between oxide isolation regions 219, 220 and 230, 231, respectively. In one embodiment, P substrate contacts 243 and 245 are heavily doped P type regions. P substrate contacts allow an appropriate bias voltage, such as ground, to be applied to P substrate 202.

Figure 3:
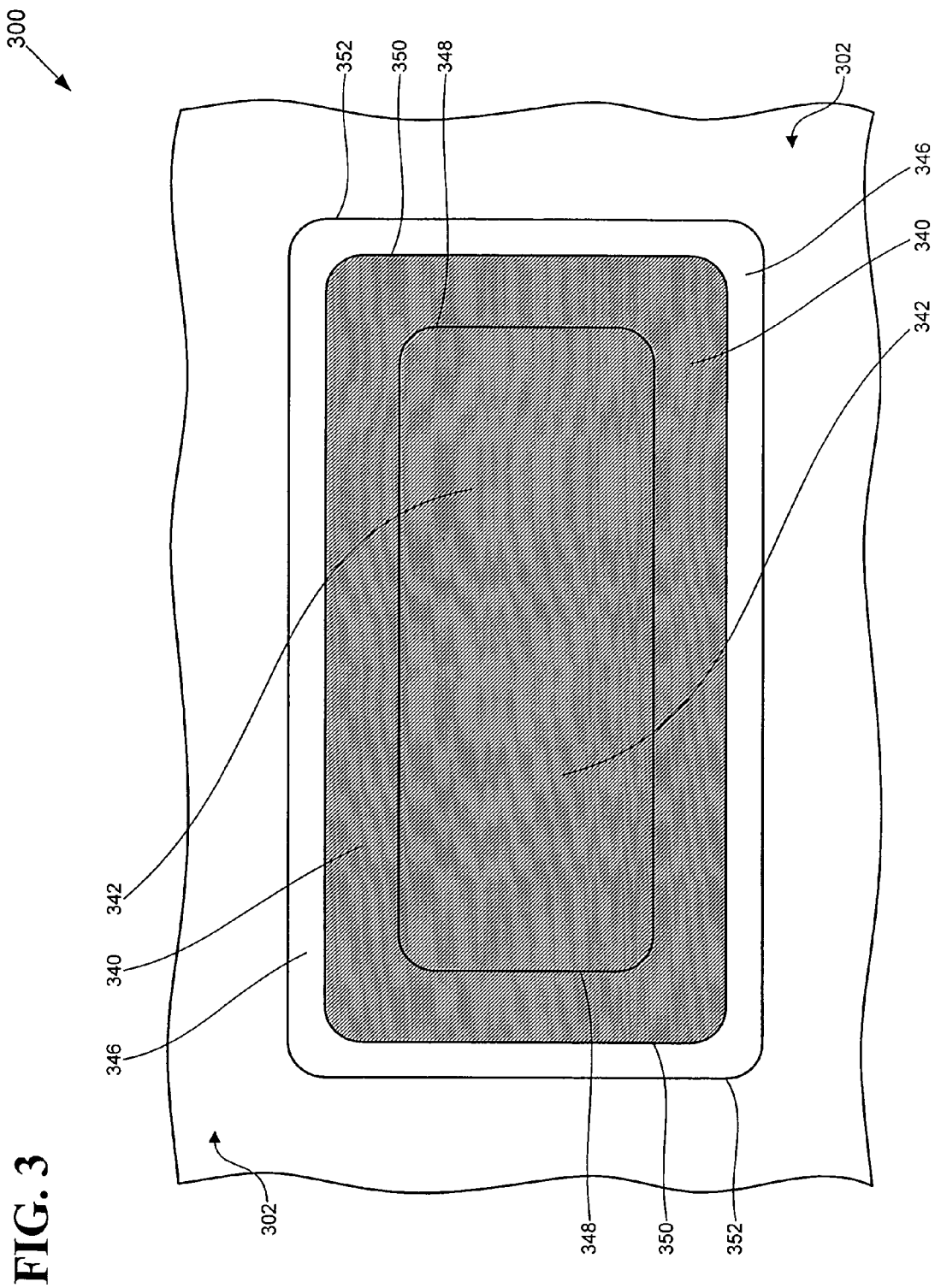
FIG. 3 shows a top view of a structure according to one embodiment of the invention.

FIG. 3 shows a top view of a portion of a semiconductor die comprising an exemplary structure in accordance with one exemplary embodiment of the present invention. Elements 302, 342, 340 and 346 of structure 300 of FIG. 3 are analogous to elements 202, 242, 240 and 246, respectively, of structure 200 of FIG. 2C. FIG. 3 shows the isolation of isolated P well 342 from P substrate 302 by lateral isolation N well 346 and deep N well 340. As shown in FIG. 3, structure 300 includes, among other things, deep N well 340, lateral isolation N well 346 and isolated P well 342, all situated in P substrate 302. Isolated P well 342 comprises the area within boundary 348. Deep N well 340 comprises the area within boundary 350. Lateral isolation N well 346 comprises the area between boundary 348 and boundary 352. Thus, isolated P well 342 is laterally surrounded by lateral isolation N well 346. Isolated P well 342 is isolated from substrate 302 by lateral isolation N well 346 and deep N well 340.

In sum, forming a triple well structure in the manner described above advantageously allows a deep N well to be formed using thinner photoresist masks and lower energy implants as compared to conventional techniques. Thus, increased fabrication throughput is achieved due to the ability to achieve a reduced implant depth during shorter time intervals. Moreover, implant accuracy is increased due to use of lower energy implants, smaller depths, and thinner photoresist, which together allow a more accurate control over the geometry and depth of the implanted regions.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. For example, a PFET can be situated within the deep N well of the present invention, where an N well of the PFET is electrically connected to the deep N well.

A deep N well, fabricated according to the present invention, can be used in forming NFETs in digital circuit blocks where the deep N well is placed below such digital circuit blocks comprising NFETs and PFETs without reducing their performance. Moreover, to appropriately bias digital circuit blocks, deep N wells can be biased at Vdd, isolated P wells biased at ground, while providing the flexibility to maintain the P substrate at a bias voltage different than the isolated P well. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, deep N wells in triple well structures and method for fabricating same have been described.

The invention claimed is:

1. A structure in a semiconductor die comprising:
a P substrate;
an epitaxial layer situated above said P substrate;
at least one P substrate contact situated in said epitaxial layer, said at least one P substrate contact allowing a bias voltage to be applied to said P substrate;
a deep N well situated in said P substrate, said deep N well being situated at a depth below a top surface of said P substrate such that a portion of said P substrate is situated between said deep N well and said epitaxial layer;
a lateral isolation N well situated in said P substrate and said epitaxial layer, said lateral isolation N well being a lightly doped N type region extending from a top surface of said epitaxial layer to said deep N well;
an isolated P well situated over said deep N well, said isolated P well being laterally surrounded by said lateral isolation N well, said isolated P well extending completely through said epitaxial layer;
said isolated P well being electrically isolated from said P substrate by said deep N well and said lateral isolation N well.

2. The structure of claim 1 wherein said deep N well is a heavily doped N type region.

3. The structure of claim 1 wherein said isolated P well is a lightly doped P type region extending from said top surface of said epitaxial layer to said deep N well.

4. The structure of claim 3 wherein said isolated P well is defined by a P well mask.

5. The structure of claim 1 wherein said isolated P well comprises at least one NFET.

6. The structure of claim 1 wherein said isolated P well comprises at least one P well contact, wherein said at least one P well contact allows a bias voltage to be applied to said isolated P well.

7. A structure in a semiconductor die comprising:
a P substrate;
an epitaxial layer situated above said P substrate;
at least one P substrate contact situated in said epitaxial layer, said at least one P substrate contact allowing a bias voltage to be applied to said P substrate;
a deep N well situated in said P substrate, said deep N well being situated at a depth below a top surface of said P substrate such that a portion of said P substrate is situated between said deep N well and said epitaxial layer, said deep N well being a heavily doped N type region;
a lateral isolation N well situated in said P substrate and said epitaxial layer, said lateral isolation N well being a heavily doped N type region extending from a top surface of said epitaxial layer to said deep N well;

an isolated P well situated over said deep N well, said isolated P well being laterally surrounded by said lateral isolation N well, said isolated P well extending completely through said epitaxial layer;

said isolated P well being electrically isolated from said P substrate by said deep N well and said lateral isolation N well.

8. The structure of claim 7 wherein said isolated P well is a lightly doped P type region extending from said top surface of said epitaxial layer to said deep N well.

9. The structure of claim 7 wherein said isolated P well comprises at least one NFET.

10. The structure of claim 9 wherein said isolated P well is defined by a P well mask.

11. The structure of claim 7 wherein said epitaxial layer comprises single crystal silicon.

12. The structure of claim 7 wherein said lateral isolation N well comprises at least one N well contact, wherein said at least one N well contact allows a bias voltage to be applied to said lateral isolation N well.

13. The structure of claim 7 wherein said isolated P well comprises at least one P well contact, wherein said at least one P well contact allows a bias voltage to be applied to said isolated P well.

* * * * *